United States Patent
Sawada et al.

[19]

[11] Patent Number: 6,120,912
[45] Date of Patent: Sep. 19, 2000

[54] COATING SOLUTIONS FOR USE IN FORMING BISMUTH-BASED FERROELECTRIC THIN FILMS, AND FERROELECTRIC THIN FILMS, FERROELECTRIC CAPACITORS AND FERROELECTRIC MEMORIES FORMED WITH SAID COATING SOLUTIONS, AS WELL AS PROCESSES FOR PRODUCTION THEREOF

[75] Inventors: Yoshihiro Sawada; Akira Hashimoto, both of Kanagawa-ken; Tetsuya Osaka, Tokyo; Ichiro Koiwa, Tokyo; Juro Mita, Tokyo; Yoshinori Maeno, Tokyo; Yukihisa Okada, Tokyo; Hiroyo Kato, Tokyo, all of Japan

[73] Assignees: Tokyo Ohka Kogyo Co., Ltd.; Oki Electric Industry Co., Ltd., both of Japan

[21] Appl. No.: 09/102,048

[22] Filed: Jun. 22, 1998

Related U.S. Application Data

[62] Division of application No. 09/007,752, Jan. 15, 1998.

[30] Foreign Application Priority Data

Jan. 18, 1997 [JP] Japan ....................... 9-19833
Jan. 29, 1997 [JP] Japan ....................... 9-29605

[51] Int. Cl.[7] ............... B32B 9/00; B05B 3/10; B05D 1/36
[52] U.S. Cl. .................. 428/470; 428/697; 428/701; 427/126.3; 427/126.5; 427/419.8; 106/1.05
[58] Field of Search .................... 428/469, 470, 428/471, 472, 689, 692, 694, 697, 701; 438/3; 427/126.3, 126.5, 419.8; 106/1.05, 1.13, 1.15

[56] References Cited

U.S. PATENT DOCUMENTS 4,579,594  4/1986  Nanao et al. ............... 106/287.24
4,668,299  5/1987  Nanao et al. ............... 106/419
5,196,388  3/1993  Shyu .......................... 501/134
5,271,797  12/1993  Kamisawa .................. 216/87
5,593,495  1/1997  Masuda et al. ............. 117/4
5,807,495  9/1998  Ogi et al. ................... 252/62.9

FOREIGN PATENT DOCUMENTS 0 807 965  11/1997  European Pat. Off. .
61-86423  5/1986  Japan .
5-298920  11/1993  Japan .

(List continued on next page.)

OTHER PUBLICATIONS

T. Takenaka, *Japan Society of Applied Physics*, Catalog No. AP 942235, pp. 1–8, Nov. 22, 1994.

T. Shiosaki, *Ceramics*, 30(6), 499–507 (1995), no month.

T. Atsuki et al., *Proceeding of the 12th Meeting of Ferroelectric Materials and their Applications*, Paper No. 24–TP–11, pp. 57–58 (May 1995).

(List continued on next page.)

*Primary Examiner*—Deborah Jones
*Assistant Examiner*—Stephen Stein
*Attorney, Agent, or Firm*—Wenderoth, Lind & Ponack, L.L.P.

[57] ABSTRACT

The invention discloses a coating solution for use in forming Bi-based ferroelectric thin films containing Bi, metallic element A (at least one selected from the group consisting of Bi. Pb, Ba, Sr, Ca, Na, K and rare earth elements) and metallic element B (at least one selected from the group consisting of Ti, Nb, Ta, W, Mo, Fe, Co and Cr), wherein it contains metal alkoxides of Bi, metallic element A and metallic element B respectively, and contains composite metal alkoxides formed by any two or more of said metal alkoxides; and a ferroelectric thin film, a ferroelectric capacitor and a ferroelectric memory formed by the use of such coating solution, and a method for producing the same.

4 Claims, 9 Drawing Sheets

FOREIGN PATENT DOCUMENTS

| | | |
|---|---|---|
| 8-91841 | 4/1996 | Japan . |
| 9-77592 | 3/1997 | Japan . |
| WO94/10084 | 5/1994 | WIPO . |
| WO96/41375 | 12/1996 | WIPO . |

OTHER PUBLICATIONS

H. Watanabe et al., *Proceeding of the 12th Meeting of Ferroelectric Materials and their Applications*, Paper No. 26–TC–10, pp. 139–140 (May 1995).

T. Atsuki et al., *Jpn. J. Appl. Phys.*, 34(9B), 5096–5099(1995).

S. Desu et al., *Materials Science and Engineering*, B34(1), L04–L08 (Oct. 1995).

H. Wang et al., *Mat. Res. Soc. Symp. Proc.*, 243, 213–216 (1992) No Month.

*Patent Abstracts of Japan*, 97(2), abstract of JP 08–277197 (Oct. 1996).

COATING SOLUTIONS FOR USE IN FORMING BISMUTH-BASED FERROELECTRIC THIN FILMS, AND FERROELECTRIC THIN FILMS, FERROELECTRIC CAPACITORS AND FERROELECTRIC MEMORIES FORMED WITH SAID COATING SOLUTIONS, AS WELL AS PROCESSES FOR PRODUCTION THEREOF

This is a divisional application of Ser. No. 09/007,752, filed Jan. 15, 1998.

BACKGROUND OF THE INVENTION

1. Field of the Invention

The present invention relates to coating solutions for use in forming Bi-based ferroelectric thin films, and ferroelectric thin films, ferroelectric capacitors and ferroelectric memories formed with said coating solutions, as well as processes for production thereof. More particularly, the invention relates to coating solutions that lead to little leakage current, are capable of forming dense Bi-based ferroelectric thin films, are applicable to electrodes other than a Pt one, and have good keeping quality. The invention also relates to ferroelectric thin films, ferroelectric capacitors, and ferroelectric memories formed with such coating solutions, as well as processes for the production thereof.

2. Description of Related Art

Thin films of bismuth layer-structured ferroelectrics (BLSF) represented by the general formula $(Bi_2O_2)^{2+}(A_{m-1}B_mO_{3m+1})^{2-}$ [where A is a mono-, di- or trivalent ion (as of Bi, Pb, Ba, Sr, Ca, Na, K or a rare earth element) or combinations of these ions; B is a tetra-, penta- or hexavalent ion (as of a metallic element like Ti, Nb, Ta, W, Mo, Fe, Co or Cr) or combinations of these ions; and m is an integer of 1–5] have recently been found to feature good characteristics such as requiring small coercive field in remanent polarization P-E hysteresis curves and hence experiencing less fatigue as a result of repeated polarization switching. This has spotlighted the potential use of BLSF thin films as materials for the fabrication of semiconductor memories and sensors (T. Takenaka, "Bismuth Layer-Structured Ferroelectrics and Their Grain Orientation" in Report of the Workshop on Applied Electronics Properties, The Japan Society of Applied Physics, pp. 1–8, Nov. 22, 1994; and "Ceramics", vol. 30, No. 6, pp. 499–503, 1995). Among the BLSF thin films so far reported, those of an $SrBi_2Ta_2O_9$ system which are represented by the formula $(Bi_2O_2)^{2+}(SrTa_2O_7)^{2-}$ are of particular interest since the desired characteristics are conspicuous in them.

Such BLSF thin films can be formed by various methods including sputtering, CVD and coated film formation. However, due to the many metal oxides that have to be incorporated as constituents, sputtering and CVD techniques require costly apparatus and considerable difficulties are involved in controlling the composition of ferroelectric thin films at desired levels; hence, these techniques are not suitable for practical applications, particularly on large-diameter substrates. In contrast, the coated film formation technique does not need expensive apparatus and can deposit films at comparatively low cost; in addition, they provide ease in controlling the composition of ferroelectric thin films at desired levels. Therefore, the coated film process for the formation of BLSF thin films holds much promise for commercial use.

While several formulations have been proposed for use as coating solutions in the formation of BLSF thin films by the coated film process, two typical cases are those prepared by dissolving carboxylate (e.g., 2-ethylhexanate) of Sr and Bi and alkoxides of Ta in acetate esters (Proceedings of the 12th Ferroelectric Materials and their Applications meeting on May 24–27, 1995, Paper presented by Mitsubishi Materials Corporation, 24-TP-11, pp. 57–58; and "Jpn. J. Appl. Phys.", vol. 34, pp. 5096–5099, 1995) and those prepared by dissolving 2-ethylhexanate of Sr, Bi, Ta, Nb, Ti, etc. in xylene to form coating solutions of a metallo-organic decomposition (MOD) type (Proceedings of the 12th Ferroelectric Materials and their Applications meeting on May 24–27, 1995, Paper presented by Olympus Optical Co., Ltd. and Symetrix Corporation, 26-TC-10, pp. 139–140). However, these coating solutions have had various problems. First, the 2-ethylhexanate of the respective metal components has a long-chain ($C_8$) organic group, so a large portion of the coating solution is occupied by the organic content and there is much loss in the coating weight due to the burning out of the organic component in the process of film formation consisting of the application of the coating solution, baking of the applied coating and crystallization and a porous film will result. In addition, the surface morphology of coating film is not satisfactory enough to provide for easy application to the fabrication of VLSI devices. Further in addition, in order to form a thin film using the applied coating, the applied coating has to be annealed at an elevated temperature of 800° C. to ensure appropriate electrical characteristics thereof, however, this is problematic from the viewpoint of semiconductor fabrication process.

The prior art coating solutions have further problems. The long-chained metal carboxylate (metallic soaps) of monobasic acids which are commonly used in the coating solutions are generally slightly soluble in polar solvents and, hence, aromatic solvents such as xylene and toluene are used to prepare the coating solutions. However, the coating solutions using such aromatic solvents have to be stored in glass or metallic containers in order to ensure that the evaporating solvents will not be lost to the ambient atmosphere. On the other hand, glass and metallic containers have the disadvantage that metallic components will dissolve out into the coating solution and this is by no means desirable in the art of semiconductor fabrication which hates the contamination with metallic impurities. Under these circumstances, it is preferred to use polyethylene or polypropylene containers which release only negligible amounts of contaminating metallic impurities, which can be protected against mechanical shocks by simple handling procedures and which are less costly and it is desired to use solvents that will leak out of the plastic containers in negligibly small amounts.

The aforementioned aromatic solvents are also very toxic to humans and subject to increasingly rigorous regulations in the methods of use, management and so forth.

If the long-chained metal carboxylate of monobasic acids are replaced by short-chained metal carboxylate of monobasic acids, little solubility is achieved in practical organic solvents. Lower alkoxides of metals are soluble in several polar solvents but on account of the great tendency to be hydrolyzed with moisture in the air, they have only poor keeping quality and practically acceptable levels of reproduction cannot be achieved in the result of coating operations.

In recent years, Pt has been employed for a lower electrode as well as an upper electrode in a semiconductor memory (ferroelectric memory) utilizing ferroelectric thin films (PZT, etc.) including the aforesaid Bi-layered ferroelectric thin film (Bi-based ferroelectric thin film). For the purpose of improving the fatigue property and simplifying fine processing, it is a general tendency to use metals such as Ir, Ru, Rh, Re and Os other than Pt, and metal oxides thereof, especially Ir, Ru and conductive metal oxides such as $IrO_2$ and $RuO_2$, are attracting the general attention as materials suitable for the above-mentioned purpose.

However, the conventional Bi-based ferroelectric thin films are not excellent in crystallinity and electrical characteristics on the electrodes made of Ir, Ru, $IrO_2$ or $RuO_2$ other than Pt, and have such problems as film fatigue resulting from repeated polarization switching and serious leakage current. There is therefore available no report of satisfactory properties in the use of electrodes made of materials other than Pt.

Under these circumstances, it has been strongly desired to develop a coating solution that is capable of forming highly dense films of good quality, with little leakage current, leading to small contents of organic components on forming a film, soluble in a practicable organic solvent, and is excellent in keeping stability, and further, achieving a Bi-based ferroelectric thin film excellent in various properties as a ferroelectric memory even with electrodes made of materials other than Pt.

SUMMARY OF THE INVENTION

An object of the present invention is therefore to provide a coating solution that contains an organometallic compound soluble in practical organic solvents, that leads to little leakage current, is capable of forming dense Bi-based ferroelectric thin films, that has good keeping quality and that ensures highly reproducible results in coating operations.

Another object of the invention is to provide Bi-based ferroelectric thin films using the coating solution.

Yet another object of the invention is to provide a ferroelectric capacitor and a ferroelectric memory using the coating solution.

As a result of intensive studies made in order to solve the foregoing problems, the present inventors obtained the following findings. Any of the conventional BLSF-based coating solutions is prepared by only mixing metal carboxylates, metal alkoxide compounds and the like in an organic solvent. This forms a factor causing an adverse effect on the formation of a ferroelectric thin film on the interface with the electrode, and a decrease in crystallinity and an increase in leakage current of the film. It is assumed that these problems are caused because the individual metal compounds are independently present in the coating solution, and metallic elements separate (segregate) during a film formation and burnout thereof, and cause changes in composition of metals in the film. It is therefore possible to achieve improvement of various properties as a ferroelectric capacitor or a ferroelectric memory by forming composite compounds of the individual metal compounds which form the Bi-based ferroelectric thin film, and further by improving its inorganicity through hydrolysis and achieving stabilization. The inventors have accomplished the present invention as a result of these findings.

More specifically, the present invention relates to a coating solution for use in forming Bi-based ferroelectric thin film containing Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), wherein it contains metal alkoxides of Bi, metallic element A (A as defined hereabove) and metallic element B (B as defined hereabove) respectively, and contains composite metal alkoxides formed by any one of two or more of said metal alkoxides.

The invention relates to a ferroelectric thin film formed by applying the foregoing coating solution onto an electrode on a substrate, optionally exposing the applied coating to a humidified atmosphere and then baking (annealing) the coating.

The invention further relates to a ferroelectric capacitor having an electrode formed on the above-mentioned ferroelectric thin film.

The invention relates to a ferroelectric memory using the aforesaid capacitor.

In addition, the invention relates to a process producing a ferroelectric thin film by the steps of:

(I) forming an electrode over a substrate;

(II) applying a coating solution for use in forming a ferroelectric thin film onto the electrode; and (III) annealing the applied coating;

wherein the process uses, as the coating solution for use in forming ferroelectric thin films, a Bi-based coating solution for use in forming ferroelectric thin films, containing Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), wherein it contains metal alkoxides of Bi, metallic element A (A as defined hereabove) and metallic element B (B as defined hereabove) respectively, and contains composite metal alkoxides formed by any two or more of said metal alkoxides.

Further, the invention relates to a process for producing a ferroelectric capacitor by the steps of:

(I) forming an electrode over a substrate;

(II) applying a coating solution for use in forming a ferroelectric thin film onto the electrode;

((III) annealing the applied coating to form a ferroelectric thin film; and (IV) forming an electrode over the ferroelectric thin film; wherein the process uses, as the coating solution for use in forming ferroelectric thin films, a Bi-based coating solution for use in forming ferroelectric thin films, containing Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), wherein it contains metal alkoxides of Bi, metallic element A (A as defined hereabove) and metallic element B (B as defined hereabove) respectively, and contains composite metal alkoxides formed by any two or more of said metal alkoxides.

DETAILED DESCRIPTION OF THE INVENTION

Figure 1:
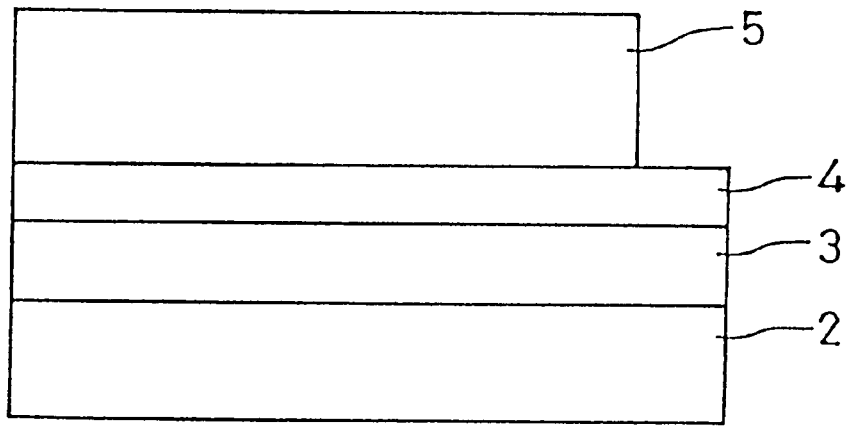
FIG. 1 shows schematically a structure of the ferroelectric thin film of the invention.

Unless otherwise noted, the expression reading "a saturated or unsaturated hydrocarbon group having 1–6 carbon atoms" refers to a group with 1–6 carbon atoms that comprises carbon and hydrogen atoms in the presence of single or unsaturated carbon-carbon bonds. The "hydrocarbon group" to be used in the invention is either an aromatic or an aliphatic hydrocarbon group but aliphatic hydrocarbon groups are preferred, with alkyl groups being particularly preferred.

The "alkyl group having 1–6 carbon atoms" may be either straight-chained or branched and is exemplified by methyl, ethyl, propyl, i-propyl, butyl, t-butyl, pentyl, neopentyl and hexyl groups.

The "alkoxyl group having 1–6 carbon atoms" may be either straight-chained or branched and is exemplified by methoxy, ethoxy, propoxy, i-propoxy, butoxy, t-butoxy and neopentoxy groups.

The coating solution to be used in the invention for forming Bi-based ferroelectric thin films contains Bi, metallic element A (which is at least one metallic element selected from the group consisting of Bi, Pb, Ba, Sr, Ca, Na, K and rare earth elements) and metallic element B (which is at least one metallic element selected from the group consisting of Ti, Nb, Ta, W, Mo, Fe, Co and Cr), which further contains metal alkoxides of Bi, metallic element A (A as defined hereabove) and metallic element B (B as defined hereabove), and composite metal alkoxides formed by two or more of said metal alkoxides.

The coating solution of the present invention is preferably one that is to form Bi-based ferroelectric thin films represented by the general-formula (I):

$$A_a Bi_x B_b O_y \quad (I)$$

where A is at least one metallic element selected from the group consisting of Bi, Pb, Ba, Sr, Ca, Na, K and rare earth elements; B is at least one metallic element selected from the group consisting of Ti, Nb, Ta, W, Mo, Fe, Co and Cr; and $1 \leq x \leq 4$, $0.5 \leq a \leq 2$, $2 \leq b \leq 5$, and $y=[3x+a$ (valency of metallic element A)+b (valency of metallic element B)]/2.

It is particularly preferable to use a coating solution for forming a Bi-based ferroelectric thin film represented by the following general formula (II):

$$Sr_a Bi_x (Ta_{2-c}, Nb_c) O_y \quad (II)$$

where, $1 \leq x \leq 4$, $0.5 \leq a \leq 2$, $y=(3x+2a+5c)/2$ and $0 \leq c < 2$.

Organometallic compounds, which are preferably contained in the solution for forming Bi-based ferroelectric thin films of the invention, are obtainable by (1) hydrolyzing the composite metal alkoxides with water alone or in combination with a catalyst; (2) hydrolyzing the composite metal alkoxides with water alone or in combination with the catalyst, and then reacting them with a stabilizer; (3) reacting the composite metal alkoxides with the stabilizer; or (4) reacting the composite metal alkoxides with the stabilizer, and then hydrolyzing them with water alone or in combination with the catalyst. These organometallic compounds may further be reacted with the stabilizer. The stabilizer mentioned above should preferably be at least one selected from the group consisting of carboxylic anhydrides, dicarboxylic acid monoesters, β-diketones and glycols.

The aforesaid composite metal alkoxides are exemplified as the following specific examples (a)–(d):

(a) composite metal alkoxides including ABi composite metal alkoxide and B metal alkoxide;

(b) composite metal alkoxides including BiB composite metal alkoxide and A metal alkoxide;

(c) composite metal alkoxides including AB composite metal alkoxide and Bi metal alkoxide; and (d) composite metal alkoxides including ABiB composite metal alkoxide.

More specifically, the composite metal alkoxides in the present invention include composite metal alkoxides comprising at least two different metal alkoxides selected from the group consisting of metallic element A, metallic element B and Bi. By forming a composite material from two or more different metal alkoxides, it is possible to inhibit separation (segregation) of a metallic element each and burnout thereof.

A composite metal alkoxide as used in the invention is a compound obtainable by refluxing different metal alkoxides in a solvent at a temperature within a range of from 30 to 100° C. for about 2 to 15 hours. Toward the end of reaction, the liquid is gradually discolored to finally become a brown liquid. The time point when the liquid has completely been discolored as described above may be regarded as the end point of reaction. The composite metal alkoxide thus obtained is considered to be one defined in the "Manufacturing Method of Glass Ceramics by Sol-Gel Process and Applications" (Applied Tech. Pub. Co., Jun. 4, 1989), pp. 46–47, and to be expressed in detail by: $ABi(OR^1)_m(OR^2)_3$, $BBi(OR^3)_n(OR^2)_3$, $AB(OR^1)_m(OR^3)_n$, $ABBi(OR^1)_m(OR^3)_n(OR^2)_3$ (where A and B are as defined hereabove; m is a valency of metallic element A; n is a valency of metallic element B; and $R^1$, $R^2$ and $R^3$ respectively represent alkyl groups having 1–6 carbon atoms independently of each other). Among these, $ABi(OR^1)_m(OR^2)_3$, $BBi(OR^3)_n(OR^2)_3$, or $ABBi(OR^1)_m(OR^3)_n(OR^2)_3$, those are composite compounds of Bi are preferably used in order to inhibit separation (segregation) of Bi that is believed to have a particularly high sublimation.

The metal alkoxides and the composite metal alkoxides are formed from alcohols which are preferably represented by the general formula (VII):

$$R^8OH \tag{VII}$$

where $R^8$ is a saturated or unsaturated hydrocarbon group having 1–6 carbon atoms. Specific examples of such alcohols include methanol, ethanol, propanol, butanol, amyl alcohol and cyclohexanol.

Apart from these, alcohols in which hydrogen atoms in $R^8$ are substituted by alkoxyl groups of 1–6 carbon atoms may also be used and specific examples include methoxymethanol, methoxyethanol, ethoxymethanol and ethoxyethanol.

In these metal alkoxides and composite metal alkoxides, part of the alkoxyl groups may be substituted with carboxylic anhydride, dicarboxylic acid monoester, β-diketone or glycol described later.

In the coating solution of the invention, hydrolysis of the foregoing composite metal alkoxides with water alone or in combination with a catalyst permits inhibition of separation (segregation) and burnout of the individual metallic element through forming bonds of metallic elements (metalloxane bonds) together with oxygen such as (—Ta—O—Sr—O—Bi—). This is preferable since it enables to improve an inorganicity of the film.

In order to perform the hydroxylic reaction, water alone or in combination with a catalyst may be added to the coating solution, which then is stirred at 20–50° C. for several hours to several days. Any catalysts such as metal alkoxides that are known in the art of hydrolysis may be employed and exemplary catalysts include acid catalysts such as inorganic acids including, for example, hydrochloric acid, sulfuric acid and nitric acid; and organic acids such as acetic acid, propionic acid and butyric acid; and inorganic or organic alkali catalysts such as sodium hydroxide, potassium hydroxide, ammonia, monoethanolamine, diethanolamine and tetramethylammonium hydroxide. In the present invention, it is particularly preferable to use acid catalysts because, for inorganic alkali catalysts such as sodium hydroxide and potassium hydroxide, metallic ions of sodium and potassium may remain in the coating solution and therefore may exert an adverse effect on the electric properties of the film, and for nitrogen-containing alkali catalysts such as ammonia and amine, a high-boiling-point nitride compound may be formed after hydrolytic reaction and therefore may exert an adverse effect on densification of the film during baking (annealing).

Hydrolytic reaction may also be performed by exposing the surface of the as-applied coating on an electrode to a humidified atmosphere at a temperature of about 50–120° C. for about 10–60 minutes at a humidity of about 50–100%.

The conditions of hydrolytic reaction are in no way limited to those set forth above and they may be selected as appropriate for the specific use of the coating.

The hydrolytic treatment is effective in not only reducing the organic content of the dried coating but also forming metaloxane bonds of metallic elements, and hence, the separation (segregation) of Bi and other metallic elements, as well as the loss of the organic content due to burning, can be suppressed. The reason would be as follows: Each of the organometallic compounds has respective organic groups in its structure. Hydrolytic treatment causes elimination of organic groups such as alkoxyl groups and thereby metalloxane bonds can be made of a higher inorganic property. The eliminated organic groups are to be low-boiling-point alcohols and glycols. Those alcohols and glycols remain in the coating solution or the film, however, are evaporated together with the solvent in the drying step. Therefore, inorganic property of the film becomes higher before submitted to annealing process, thereby a dense film may be formed. The composite metal compounds and the metalloxane bonds are attributed to strengthen binding of the metallic elements, and therefore separation (segregation) and burning off of metallic elements such as Bi, and increase of a leakage current can be suppressed.

The aforementioned hydrolytic treatment may be carried out after the reaction with the stabilizer of the composite metal alkoxides. The reaction with the stabilizer may be carried out with the optionally hydrolyzed composite metal alkoxides.

The stabilizer is for improving the keeping stability of the coating solution, and particularly, for increasing viscosity of the coating solution after hydrolysis. In the invention, at least one is preferably used as selected from the group consisting of carboxylic anhydrides, dicarboxylic acid monoesters, β-diketones and glycols.

Regarding carboxylic anhydrides, at least one compound is preferably used as selected from among the carboxylic anhydrides represented by the general formula (III):

$$R^1(CO)_2O \tag{III}$$

where $R^1$ is a divalent saturated or unsaturated hydrocarbon group having 1–6 carbon atoms. Specific example of the carboxylic anhydrides that can be used in the invention include maleic anhydride, citraconic anhydride, itaconic anhydride, succinic anhydride, methylsuccinic anhydride, glutaric anhydride, α-methylglutaric anhydride, α,α-dimethylglutaric anhydride and trimethylsuccinic anhydride.

At least one compound is preferably used as dicarboxylic acid monoesters as selected from among the dicarboxylic acid monoesters represented by the general formula (IV):

$$R^2OCOR^3COOH \tag{IV}$$

where $R_2$ is a saturated or unsaturated hydrocarbon group having 1–6 carbon atoms; $R^3$ is a divalent saturated or unsaturated hydrocarbon group having 1–6 carbon atoms.

Such dicarboxylic acid monoesters may be half esters prepared by reacting dibasic carboxylic acids with alcohols. Specific examples of dibasic carboxylic acids are oxalic acid, malonic acid, succinic acid, glutaric acid, adipic acid, pimelic acid, suberic acid, azelaic acid, sebacic acid, maleic acid, citraconic acid, itaconic acid, methylsuccinic acid, α-methylglutaric acid, α,α-dimethylglutaric acid and trimethylglutaric acid; at least one of these dibasic acids may be esterified with at least one alcohol as selected from among methyl alcohol, ethyl alcohol, propyl alcohol, butyl alcohol, amyl alcohol, hexyl alcohol, ethylene glycol monomethyl ether, propylene glycol monomethyl ether, etc., by known methods.

At least one compound is preferably used as β-diketones as selected from among the β-diketones including the β-ketoesters represented by the general formula (V):

$$R^4COCR^5HCOR^6 \tag{V}$$

where $R^4$ is a saturated or unsaturated hydrocarbon group having 1–6 carbon atoms; $R^5$ is H or $CH_3$; and $R^6$ is an alkyl or alkoxyl group having 1–6 carbon atoms.

Specific examples of the β-diketones to be used in the invention include acetylacetone, 3-methyl-2,4-pentanedione and benzoylacetone. Exemplary β-ketoesters include ethyl acetoacetate and diethyl malonate. Other complex formers may of course be employed; however, dipivaloylmethane and THF adducts thereof, as well as complex formers such as hexafluoroacetylacetone that form metal halides after annealing are not suitable for use in the production of the coating solution of the invention since they form highly sublimable or volatile metal complexes.

At least one compound is preferably used as glycols as selected from among the glycols represented by the general formula (VI):

$$HOR^7OH \qquad (VI)$$

where $R^7$ is a divalent saturated or unsaturated hydrocarbon group having 1–6 carbon atoms.

Specific examples of the glycols that can be used in the invention include ethylene glycol, diethylene glycol, propylene glycol, dipropylene glycol, butane diol, pentane diol, hexylene glycol and glycerin glycol. These glycols are especially effective when they are used in combination with β-diketones as a stabilizer and the effect to be achieved is the enhanced stability of the liquid after subsequent hydrolysis.

The stabilizers mentioned above are preferably be short-chained ones having 1–6 carbon atoms in order to enhance the polarity of the metal compounds and inorganic property of the film after the drying step.

In the BLSF coating solution of the invention, separation (segregation) and loss of individual metallic elements due to burning can be suppressed by converting metal alkoxides into composite metal alkoxides. For example, when metal alkoxides are independently present in the solution, separation (segregation) or burnout of metallic elements having a high sublimation such as Bi may occur, and it results in the shortage of Bi in crystal grains. This may lead to deterioration of crystallinity of the SBT film or separation (segregation) of conductive metal Bi, thus causing an increase in leakage of current. Due to the composite metal compounds, however, bindings between metallic elements each are strengthen, and separation (segregation) as well as burnout of the metallic elements such as Bi can be repressed, and therefore a leakage of current can be inhibited. Further, separation of each metallic elements is inhibited by polymerization such as (—Bi—O—Ta—) through hydrolysis. Enhancement of the inorganic property of the film makes it possible to form a dense BLSF thin film.

In the baking (annealing) step of the film utilizing a rapid heating treatment known as RTP (Rapid Thermal Processing) as well, achievement of composite compounds and hydrolysis permits inhibition of specified metallic element such as Bi at grain boundaries, and an improvement crystallinity of fine particles composed of the individual metallic elements.

The coating solution of the invention is prepared by dissolving the above-mentioned composite metal alkoxides or reaction products (organometallic compounds) in a solvent having oxygen atoms in molecules thereof. Applicable solvents include, for example, alcoholic solvents, polyhydric alcohol-based solvents, ether-based solvents, ketone-based solvents, ester-based solvents, and lower carboxylic acid-based solvents.

Exemplary alcoholic solvents include methanol, ethanol, propanol, butanol, amyl alcohol, cyclohexanol and methyl cyclohexanol.

Exemplary polyhydric alcohol-based solvents include ethylene glycol monomethyl ether, ethylene glycol monoacetate, diethylene glycol monoethyl ether, diethylene glycol monoacetate, propylene glycol monoethyl ether, propylene glycol monoacetate, dipropylene glycol monoethyl ether and methoxybutanol.

Exemplary ether-based solvents include methylal, diethyl ether, dipropyl ether, dibutyl ether, diamyl ether, diethyl acetal, dihexyl ether, trioxane and dioxane.

Exemplary ketone-based solvents include acetone, methyl ethyl ketone, methyl propyl ketone, methyl isobutyl ketone, methyl amyl ketone, methyl cyclohexyl ketone, diethyl ketone, ethyl butyl ketone, trimethyl nonanone, acetonitrile acetone, dimethyl oxide, phorone, cyclohexanone and diacetone alcohol.

Exemplary ester based solvents include ethyl formate, methyl acetate, ethyl acetate, butyl acetate, cyclohexyl acetate, methyl propionate, ethyl butyrate, ethyl oxoisobutyrate, ethyl acetoacetate, ethyl lactate, methoxybutyl acetate, diethyl oxalate and diethyl malonate.

Exemplary lower carboxylic acid-based solvents include acetic acid, propionic acid, butyric acid, and valeric acid.

In the stabilizing treatment and treatment for achieving a composite compound of metallic compounds, reaction of these solvents, particularly alcoholic solvents, may partially be done with the metallic compounds.

The solvents listed above may be used either singly or in admixture.

The organometallic compounds of the invention are also highly soluble in aromatic hydrocarbon-based solvents; however, as already mentioned, these solvents are not preferred since they are subject to increasingly rigorous regulations on the methods of their use and management.

The selection of the most preferred solvent depends on specific coating conditions such as those of open spin coating, closed spin coating, liquid source misted chemical vapor deposition (LSM-CVD) and dip coating.

The coating solution of the invention uses practicable organic solvent, has a satisfactory keeping stability, and permits formation of a high-density and good-quality Bi-based ferroelectric thin film on an electrode made of at least one metal and/or metal oxide thereof selected from the group consisting of metals and conductive metal oxides, other than Pt, including Ir, Ru, Rh, Re and Os recently attracting the general attention, particularly Ir, Ru, $IrO_2$ or $RuO_2$.

By using the foregoing metals and/or metal oxides thereof for the upper electrode on the aforesaid ferroelectric thin film, there is available a high-density and good-quality Bi-based ferroelectric memory.

With a view to improving electrical characteristics, annealing (secondary annealing) is often applied at a high temperature of about 800° C. after forming an upper electrode. Surprisingly, the Bi-based ferroelectric thin film of the invention gives a small leakage current and appropriate electrical characteristics even without annealing (secondary annealing) after forming the upper electrode (particularly when using an electrode of metal or a conductive metal oxide other than Pt). This solved the problems of requiring two runs of annealing at a high temperature of about 800° C.

A method of producing a ferroelectric thin film and a ferroelectric capacitor using the coating solution of the invention will be described below with reference to FIGS. 1 and 2.

As shown in FIG. 1, a substrate 2 such as an Si wafer is first oxidized to form an Si oxide layer 3 which is overlaid with a lower electrode 4 that is formed from a metal such as Pt, Ir, Ru, Re or Os or a conductive metal oxide thereof by a known technique such as sputtering or vapor deposition.

The lower electrode 4 is then coated with the coating solution of the invention by a known technique such as spin coating or dip coating and the applied coating is dried at a temperature of 50–200° C., followed by prebaking at a temperature of 200–700° C. Preferably, the process from the application of the coating solution to the prebaking of the dried coating is repeated several times until a desired film thickness is attained.

When the hydrolytic reaction is caused in a humidified atmosphere, it may be done, prior to the aforesaid prebaking, at a humidity of 50–100%, preferably 70–100%, and at a temperature of 50–120° C. for 10–60 minutes.

Subsequently, annealing is performed at a temperature of about 700–900° C. in an oxygen atmosphere to form a crystalline ferroelectric thin film 5. The annealing step may be performed by any suitable method such as a furnace process in which the temperature is raised from room temperature to the annealing temperature at a rate of about 5–20° C./min, followed by annealing at that temperature for about 30–80 minutes, or a rapid thermal processing (RTP) method in which the temperature is raised from room temperature to the annealing temperature at a rate of about 50–150° C./sec, followed by annealing at that temperature for about 0.5–3 minutes.

Figure 2:
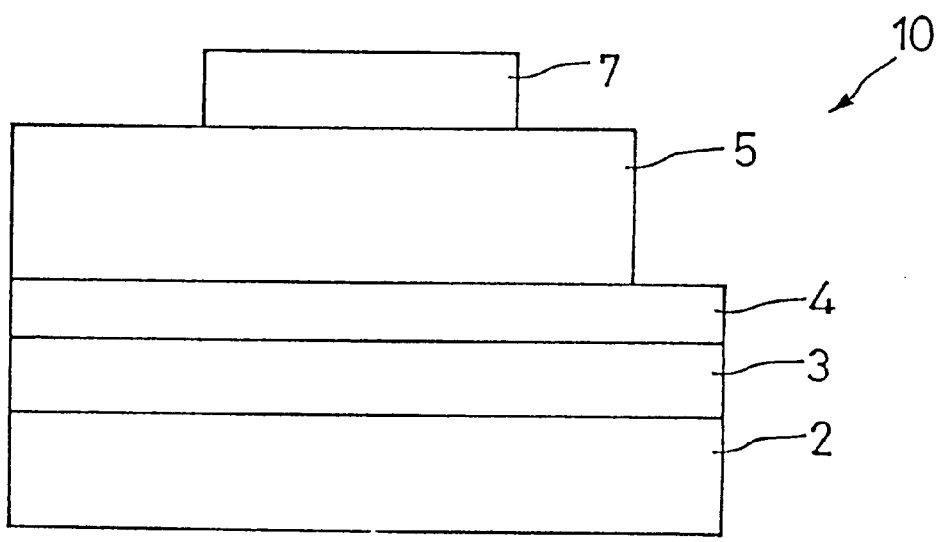
FIG. 2 shows schematically a structure of the ferroelectric capacitor forming the ferroelectric memory of the invention.

Then, as shown in FIG. 2, the thus prepared ferroelectric thin film 5 is overlaid with an electrode (upper electrode) 7, which may be formed of the metals or conductive metal oxides that have been listed in connection with the formation of the lower electrode 4; these materials are deposited on the ferroelectric thin film 5 by any known technique such as sputtering or vapor deposition to fabricate a ferroelectric capacitor 10. The upper electrode 7 may be formed of a material different from that of the lower electrode 4; for instance, Ir may be used to make the lower electrode 4 whereas Ru may be used to make the upper electrode 7. In the present invention, leakage current can be minimized and appropriate electrical characteristics are available even without conducting a secondary annealing at a high temperature after forming the upper electrode. The annealing may be applied at a high temperature of about 800° C. in an oxygen atmosphere, as required, after forming the upper electrode.

As described above, it is possible to reduce the amount of separation (segregation) and the burnout loss of metallic elements such as Bi in coating and annealing processes by converting metal alkoxides to composite metal alkoxides, followed by hydrolyzing them.

By performing treatments to composite metal alkoxides such as carboxylation, conversion to β-diketone forms and chelation, polar and highly stable organometallic compounds could successfully be synthesized with improved hydrolyzability and applicability of practical polar solvents. As a result, a polycondensation reaction could be allowed to proceed through the sol-gel method in the coating solution by a sufficient degree, and production of inorganic bonds (metalloxane bonds) such as Bi—O—Bi, Bi—O—Ta, Bi—O—Sr, and Ta—O—Bi—O—Sr could further reduce separation (segregation) and burnout loss of Bi and other metallic elements, and improve inorganicity of the entire coating solution.

Particularly, the composite metal compounds and the metalloxane bonds are attributed to strengthen binding of the metallic elements, and therefore separation (segregation) and burning off of metallic elements such as Bi, and increase of a leakage current can be suppressed. This makes it possible to form a film being excellent in crystallinity and voltage resistance.

Even if the coating solution is not rendered fully inorganic by the sol-gel method (hydrolytic treatment) or even in the case of the coating solution which is not subjected to hydrolytic treatments at all, the as-applied coating on the substrate may be exposed to a humidified atmosphere for a certain period preceding the annealing step in forming a coating film as described above and by so doing, hydrolytic polycondensation will proceed to render the coating sufficiently inorganic to form a dense film.

An excessive hydrolytic treatment in the coating solution may potentially increase the viscosity of the coating solution gel or change its properties with time. The above-mentioned hydrolytic treatment of the as-applied coating prior to annealing treatment in forming a coating film is effective in order to avoid these possibilities.

It should be noted here that if an MOD coating solution made of a metal carboxylate having a long-chain organic group as described in connection with the prior art is applied onto a substrate and if the as-applied coating is subjected to a hydrolytic treatment prior to prebaking, the progress of the reaction is either uneven or negligible and there is a limit on the denseness of the coating to be finally formed.

It should also be noted that the contents of Bi, and metallic elements A and B in the coating solution for use in forming a Bi-based ferroelectric thin film are variable with the site and conditions of the application of the coating solution. Hence, appropriate formulations can be selected depending upon various conditions such as the type of the device to which the invention is to be applied (e.g., FRAM, DRAM, MFS, MFIS or MFMIS), the type of upper and lower electrodes to be used, their thickness, combinations of the two electrodes, the type of barrier layer, its thickness, and the presence or absence of a seed layer (orientation layer).

The contents of individual organometallic compounds, the type and amount of residual alkoxyl group, the proportion of the carbonyl group to be incorporated, the degree of complex formation, the degree of hydrolysis, the degree of polycondensation and the degree of composite alkoxylation can be selected in many ways depending upon various factors such as the use of the coating solution of the invention and the conditions under which it is to be employed (e.g., temperature, time, atmosphere and the method of temperature elevation which are to be adopted in the drying and annealing steps). Therefore, the following examples of the invention are intended to describe just a few embodiments among the many fields of application of the invention and should in no way be taken as limiting.

A "1Tr-1C" DRAM having a memory cell comprises a transistor and a capacitor is now most commonly used. In the following examples, therefore, experiments were carried out by means of a ferroelectric capacitor used in such a DRAM to evaluate properties of a ferroelectric memory.

EXAMPLES

Synthesis Example 1 (Synthesis of Coating Solution 1)

(Preparation of a coating solution comprising a composite metal alkoxide of Sr, Bi and Ta) $Bi(O-nC_4H_9)_3$ and $Ta(OC_2H_5)_5$ were dissolved in methoxyethanol (MC) and an MC solution of $Sr(OC_2H_4OCH_3)_2$ was dropped into it. The resultant mixed solution was adjusted to molar ratios of Sr:Bi:Ta=0.7:2.3:2.0.

After the completion of dropping, temperature was raised to 80° C., and reflux was conducted for ten hours: color of the solution changed from transparent into black-brown. Then, heating was discontinued, and the solution was left to a solution temperature of 25° C.

After holding the solution at room temperature for 24 hours, the solvent was distilled off under reduced pressure, and the solution was concentrated to a concentration of 10 wt %, thereby synthesizing a coating solution 1 for forming a Bi-based ferroelectric thin film.

Synthesis Example 2 (Synthesis of Coating Solution 2)

(Preparation of a coating solution through conversion of a composite metal alkoxide of Sr, Bi, Ta into β-diketonized and glycolized one)

A part of the coating solution 1 obtained in synthesis Example 1 was concentrated to a concentration of 20 wt %. An MC solution containing ethyl acetoacetate in a molar amount three times as great as a mole of $Sr_{0.7}Bi_{2.3}Ta_{2.0}$ was then dropped, and the resultant solution was refluxed while heating to 80° C. for two hours.

The resultant solution was left to cool until the temperature decreased to 25° C., thereby giving a solution of a concentration of 15 wt %. Then, an MC solution containing propylene glycol in a molar amount equal to a mole of $Sr_{0.7}Bi_{2.3}Ta_{2.0}$ was added. The mixture was stirred at 25° C. for an hour, thereby synthesizing a coating solution 2 for forming a Bi-based ferroelectric thin film, having a concentration of 10 wt %.

Synthesis Example 3 (Synthesis of Coating Solution 3)

(Preparation of a coating solution through conversion of a composite metal alkoxide of Sr, Bi, Ta into carboxylic anhydride form)

A coating solution 3 for forming a Bi-based ferroelectric thin film having a concentration of 10 wt % was synthesized in the same manner as in Synthesis Example 2 except that maleic anhydride was used in place of ethyl acetoacetate and propylene glycol was not employed.

Synthesis Example 4 (Synthesis of Coating Solution 4)

(Preparation of a coating solution through conversion of a composite metal alkoxide of Sr, Bi, Ta into β-diketonized and glycolized one, followed by hydrolysis)

A part of the coating solution 2 obtained in Synthesis Example 2 was concentrated into a solution having a concentration of 12 wt %. Then, an MC solution containing $H_2O$ in a molar amount two times as great as a mole of $Sr_{0.7}Bi_{2.3}Ta_{2.0}$ was dropped, and the solution was stirred at 25° C. for two hours. Then, the resultant coating solution was reacted enough for four days in a thermostatic chamber of 40° C., and concentrated, thereby synthesizing a coating solution 4 for forming a Bi-based ferroelectric thin film, having a concentration of 10 wt %.

Synthesis Example 5 (Synthesis of Coating Solution 5)

(Preparation of a coating solution comprising a composite metal alkoxide of Sr, Bi and a Ta alkoxide)

$Bi(O-nC_4H_9)_3$ and $Sr(OC_2H_4OCH_3)_2$ were dissolved in an MC to a molar ratio of 2.3:0.7, heated to 80° C., and refluxed for ten hours: color of the solution changed from transparent to brown. Heating was then discontinued, and the solution was left to cool until temperature reached the level of 25° C.

An MC solution of Ta $(OC_2H_5)_5$ was dropped onto the resultant solution to adjust the molar ratio Sr:Bi:Ta to 0.7:2.3:2.0.

After the completion of dropping and stirring at room temperature for 24 hours, the solvent was distilled off under reduced pressure, and the solution was concentrated to a concentration of 10 wt %, thereby synthesizing a coating solution 5 for forming a Bi-based ferroelectric thin film.

Synthesis Example 6 (Synthesis of Coating Solution 6)

(Preparation of a coating solution through conversion of a coating solution comprising a composite metal alkoxide of Sr, Bi and a Ta alkoxide into β-diketonized and glycolized one, followed by hydrolysis)

$Bi(O-nC_4H_9)_3$ and $Sr(OC_2H_4OCH_3)_2$ were dissolved in an MC so as to achieve a molar ratio of 2.3:0.7, heated to 80° C., and refluxed for ten hours: color of the solution changed from transparent to brown. Thereafter, heating was discontinued and left to cool to a solution temperature of 25° C.

Then, an MC solution of ethyl acetoacetate in a molar amount three times as great as a mole of $Sr_{0.7}Bi_{2.3}$ was dropped, and the resultant solution was refluxed at 80° C. for two hours, thereby obtaining an $Sr_{0.7}Bi_{2.3}$ solution. Similarly, an MC solution of ethyl acetoacetate in a molar amount three times as great as a mole of $Ta_{2.0}$ was dropped onto an MC solution of $Ta(OC_2H_5)_5$, and the resultant solution was refluxed at 80° C. for two hours, thereby obtaining a $Ta_{2.0}$ solution.

The $Sr_{0.7}Bi_{2.3}$ solution and the $Ta_{2.0}$ solution were mixed so as to give a molar ratio Sr:Bi:Ta of 0.7:2.3:2.0, and concentrated into a concentration of 15 wt %. Then, an MC solution of propylene glycol in a molar amount equal to a mole of $Sr_{0.7}Bi_{2.3}Ta_{2.0}$ is added, and the resultant solution was stirred at 25° C. for an hour into a solution having a concentration of 12 wt %. Subsequently, an MC solution of $H_2O$ in a molar amount two times as great as a mole of $Sr_{0.7}Bi_{2.3}Ta_{2.0}$ was dropped, and the solution was stirred at 25° C. for two hours. Then, the thus obtained coating solution was reacted enough in a thermostatic chamber at 40° C. for four days, and concentrated, thereby synthesizing a coating solution 6 for forming a Bi-based ferroelectric thin film having a concentration of 10 wt %.

Synthesis Example 7 (Synthesis of Coating Solution 7)

(Preparation of a coating solution comprising a composite metal alkoxide of Bi, Ta and Sr alkoxide)

A coating solution 7 for forming a Bi-based ferroelectric thin film was synthesized in the same manner as in Synthesis Example 5 except that $Ta(OC_2H_5)_5$ was used in place of $Sr(OC_2H_4OCH_3)_2$, and $Sr(OC_2H_4OCH_3)_2$, in place of $Ta(OC_2H_5)_5$, and a molar ratio was adjusted to Sr:Bi:Ta=0.7:2.3:2.0.

Synthesis Example 8 (Synthesis of Coating Solution 8)

(Preparation of a coating solution through conversion of a coating solution comprising a composite metal alkoxide of Bi, Ta and Sr alkoxide into β-diketonized and glycolized one, followed by hydrolysis)

A coating solution 8 for forming a Bi-based ferroelectric thin film was synthesized in the same manner as in Synthesis Example 6 except that $Ta(OC_2H_5)_5$ was used in place of $Sr(OC_2H_4OCH_3)_2$, and $Sr(OC_2H_4OCH_3)_2$, in place of $Ta(OC_2H_5)_5$, and the molar ratio of Sr:Bi:Ta was adjusted to 0.7:2.3:2.0.

Synthesis Example 9 (Synthesis of Coating Solution 9)

(Preparation of a coating solution comprising a composite metal alkoxide fo Sr, Ta and Bi alkoxide)

A coating solution 9 for forming a Bi-based ferroelectric thin film was synthesized in the same manner as in Synthesis Example 5 except that $Ta(OC_2H_5)_5$ was used in place of $Bi(O-nC_4H_9)_3$, and $Bi(O-nC_4H_9)_3$, in place of $Ta(OC_2H_5)_5$, and the molar ratio of Sr:Bi:Ta was adjusted to 0.7:2.3:2.0.

Synthesis Example 10 (Synthesis of Coating Solution 10)

(Preparation of a coating solution through conversion of a coating solution comprising a composite metal alkoxide of Sr, Ta and Bi alkoxide into β-diketonized and glycolized one, followed by hydrolysis)

A coating solution 10 for forming a Bi-based ferroelectric thin film was synthesized in the same manner as in Synthesis Example 6 except that $Ta(OC_2H_5)_5$ was used in place of $Bi(O—nC_4H_9)_3$, and $Bi(O—nC_4H_9)_3$, in place of $Ta(OC_2H_5)_5$, and the molar ratio of Sr:Bi:Ta was adjusted to 0.7:2.3:2.0.

Synthesis Example 11 (Synthesis of Coating Solution 11)

(Preparation of a coating solution comprising a composite metal alkoxide of Sr, Bi, Ta and Nb)

$Bi(O—nC_4H_9)_3$, $Ta(OC_2H_5)_5$ and $Nb(OC_2H_5)_5$ were dissolved in MC, and an MC solution of $Sr(OC_2H_4OCH_3)_2$ was dropped onto the above solution to adjusted the molar ratio of Sr:Bi:Ta:Nb to 0.7:2.3:1.5:0.5.

After the completion of dropping, temperature was raised to 80° C. and the solution was refluxed for 10 hours: the color of the solution changed from transparent to black-brown. Subsequently, heating was discontinued, and the solution was left to cool at a temperature 25° C. After holding at room temperature for 24 hours, the solvent was distilled off under reduced pressure, and the solution was concentrated to a concentration of 10 wt %, thereby synthesizing a coating solution 11 for forming a Bi-based ferroelectric thin film.

Comoarative Synthesis Example 1 (Synthesis of Comparative Coating solution 1)

(Preparation of a coating solution through mixing alkoxides of Sr, Ta and Bi)

$Bi(O—nC_4H_9)_3$ and $Ta(OC_2H_5)_5$ were dissolved in MC, and an MC solution of $Sr(OC_2H_4OCH_3)_2$ was dropped into the resultant solution to adjust the molar ratio of Sr:Bi:Ta to 0.7:2.3:2.0.

After stirring at room temperature for 24 hours, the solvent was distilled off under reduced pressure and the solution was concentrated to a concentration of 10 wt %, thereby synthesizing a comparative coating solution 1 for forming a Bi-based ferroelectric thin film.

Comparative Synthesis Example 2 (Synthesis of Comparative Coating Solution 2)

(Preparation of a coating solution through mixing carboxylates of Sr, Ta and Bi $Bi[OCO(C_2H_5)C_5H_{10}]_3$ and $Ta[OCO(C_2H_5)C_5H_{10}]_5$ were dissolved in xylene, and a xylene solution of $Sr[OCO(C_2H_5)C_5H_{10}]_2$ was dropped to make adjustment to a molar ratio of Sr:Bi:Ta of 0.7:2.3:2.0.

After stirring at room temperature for 24 hours, the solvent was distilled off under reduced pressure and the solution was concentrated to a concentration of 10 wt %, thereby synthesizing a comparative coating solution 2 for forming a Bi-based ferroelectric thin film.

Examples 1 to 11 and Comparative Examples 1 and 2

I. Ferroelectric thin films

The coating solutions 1–11 and the comparative coating solutions 1 and 2 obtained in the above Synthesis Examples and Comparative Synthesis Examples were spin-coated onto (1) a Pt lower electrode having a thickness of 60 nm; (2) an Ir/$IrO_2$ lower electrode having a thickness of 100 nm/100 nm; (3) an $IrO_2$ lower electrode having a thickness of 200 nm; (4) an Ru/$RuO_2$ lower electrode having a thickness of 100 nm/100 nm; and (5) an $RuO_2$ lower electrode having a thickness of 200 nm, each formed by sputtering on a silicon wafer having a thermo-oxidized $SiO_2$ film having a thickness of 100 nm formed thereon, first at 500 rpm for five seconds, then at 2,000 rpm for 30 seconds, then dried at 150° C. for 30 minutes, prebaked at 600° C. for 30 minutes, and after repeating these operations from coating to prebaking eight times, annealed at 800° C. for 60 minutes in an oxygen atomosphere, thereby forming a ferroelectric thin film having a thickness of 300 nm.

[Surface properties of thin films]

The surface and the sectional face of each of these thin films were observed by means of SEM photography: in the coating solutions 1 to 11, each surface was excellent in surface homology and density, whereas in the comparative coating solutions 1 and 2, each surface had serious irregularities and film's density was poor.

[X-ray diffraction (XRD) measurement]

Crystallinity of the Bi-based ferroelectric (BLSF) thin films formed on the electrode was investigated by measuring strength at the (105) plane falling under the Bi-based ferroelectrics. In Table 1 showing the results, ⊚ represents a good crystallinity; ○, fair; and ×, very poor.

Some examples of XRD curve obtained from the measurement are illustrated in FIGS. 8 and 9.

Figure 8A:
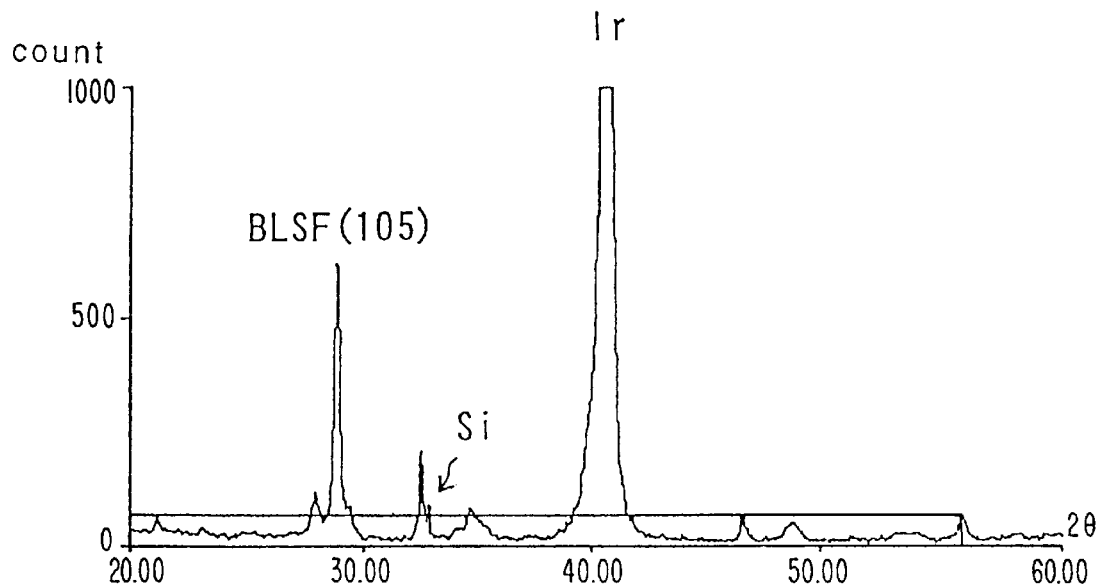
FIG. 8A illustrates an XRD curve in the case of using a lower electrode (2) in Comparative Example 1.
Figure 8B:
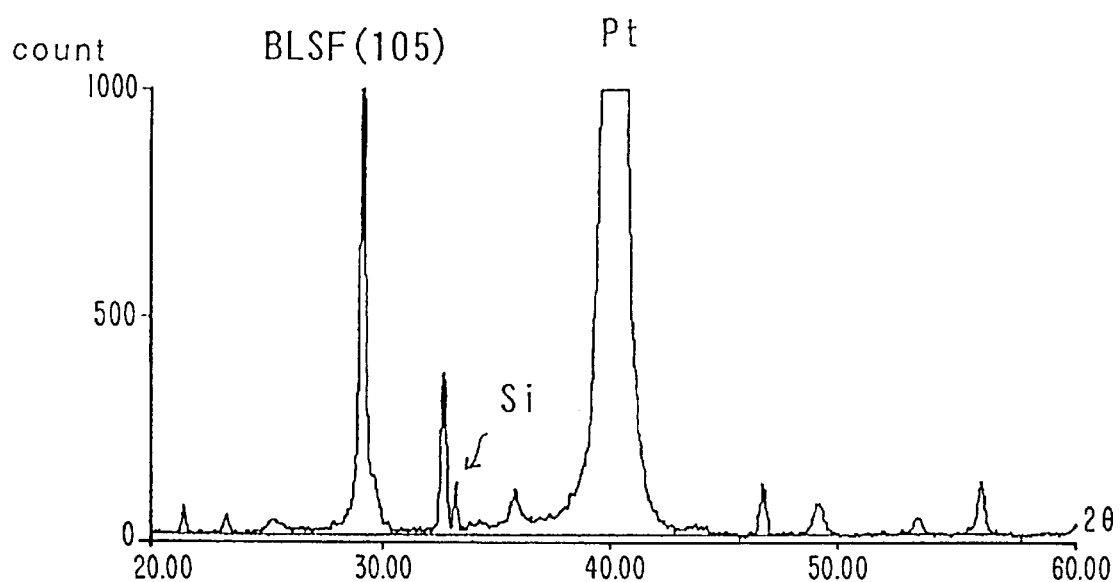
FIG. 8B illustrates an XRD curve in the case of using a lower electrode (1) in Comparative Example 1.

FIG. 8A illustrates the XRD curve in the case of using the lower electrode (2) in Comparative example 1; and FIG. 8B shows the XRD curve in the case of using the lower electrode (1) in Comparative example 1. In FIG. 8A, peaks are observed for Ir/$IrO_2$ forming the lower electrode and Si forming the substrate. In FIG. 8B, peaks are also observed for Pt forming the lower electrode and for Si forming the substrate. The strength peak at the (105) plane of the BLSF thin film formed on the lower electrode of Ir/$IrO_2$ in FIG. 8A is smaller than that of one formed on the lower electrode of Pt in FIG. 8B. This suggests that, when using a mixed metal alkoxide solution, changing the lower electrode from Pt to Ir/$IrO_2$ causes deterioration of crystallinity of the BLSF thin film to be formed.

Figure 9A:
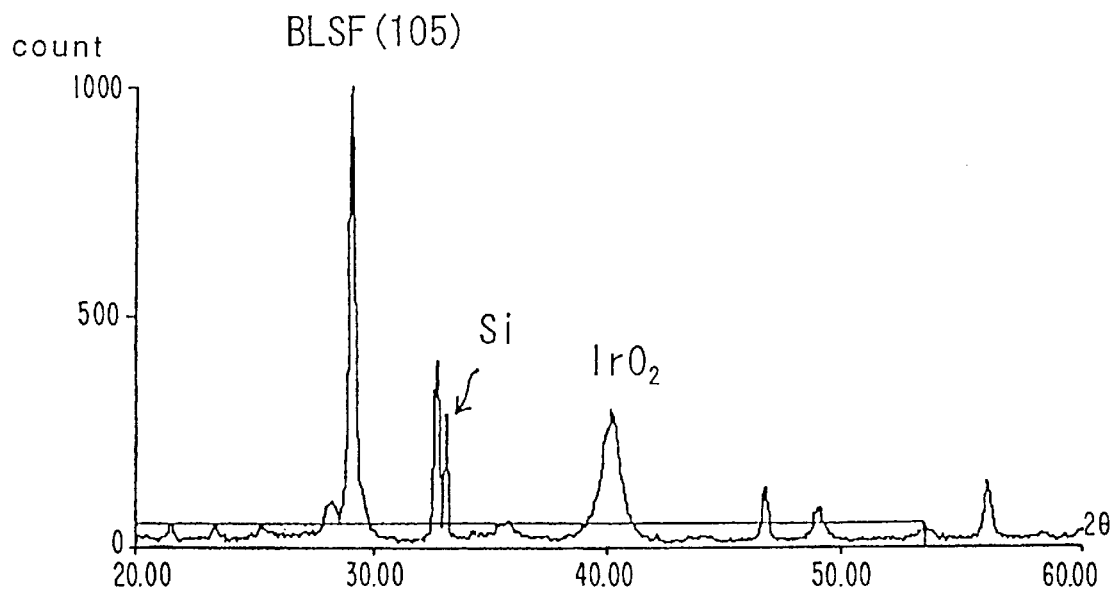
FIG. 9A illustrates an XRD curve in the case of using a lower electrode (3) in Example 4.
Figure 9B:
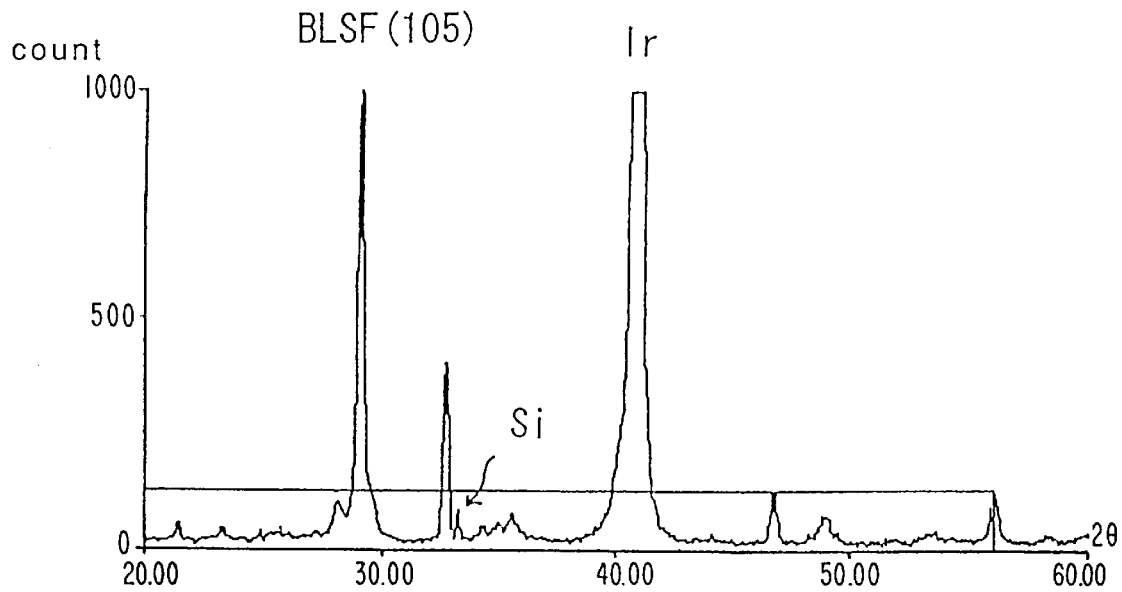
FIG. 9B illustrates an XRD curve in the case of using a lower electrode (2) in Example 4.

FIG. 9A illustrates the XRD curve in the case of using the lower electrode (3) in Example 4; and FIG. 9B, the XRD curve in the case of using the lower electrode (2) in Example 4.

As is clear from the comparison of FIGS. 9 and 8, as compared with the use of a mixed metal alkoxide solution, the use of a hydrolysis-treated composite metal alkoxide solution leads to a markedly larger strength peak of the (105) plane of the BLSF thin film even when using Ir/$IrO_2$, $IrO_2$ or the like other than Pt for the lower electrode, and this brings about a far higher strength. Even in the case of a single-layer structure of $IrO_2$, there is available a BLSF thin film having a high crystallinity as in the case of a double-layer structure of Ir/$IrO_2$.

II. Ferroelectric capacitors

Figure 3:
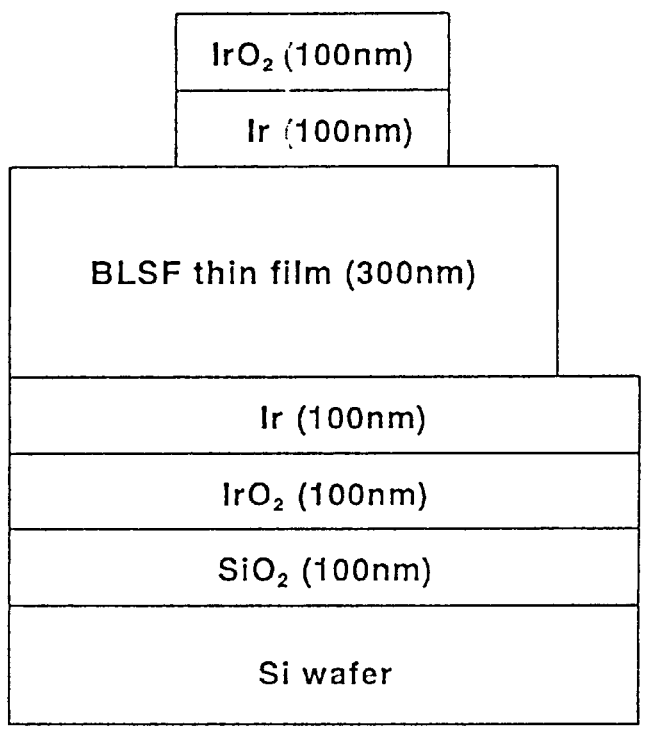
FIG. 3 shows schematically a structure of the ferroelectric capacitor used in Examples of the invention.
Figure 4:
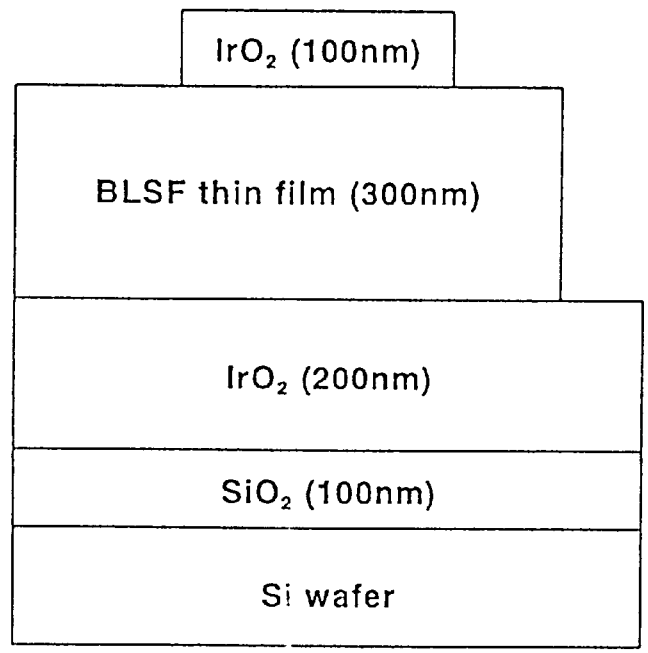
FIG. 4 shows schematically another structure of the ferroelectric capacitor used in Examples of the invention.
Figure 5:
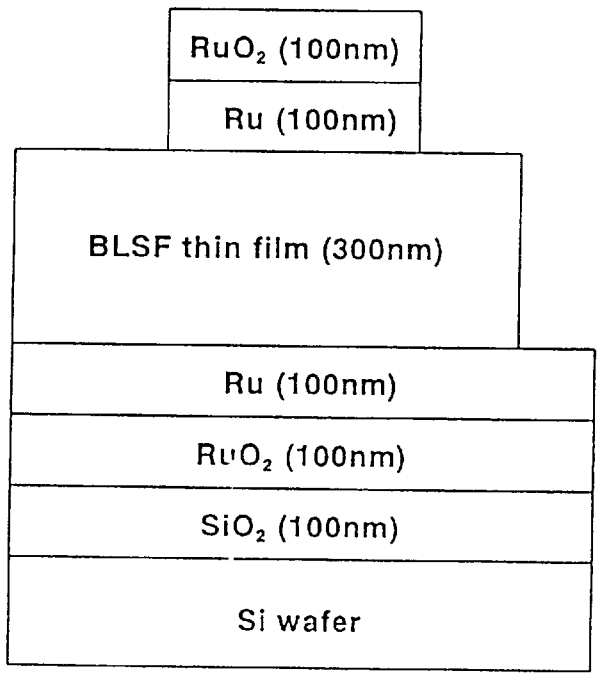
FIG. 5 shows schematically another structure of the ferroelectric capacitor used in Examples of the invention.
Figure 6:
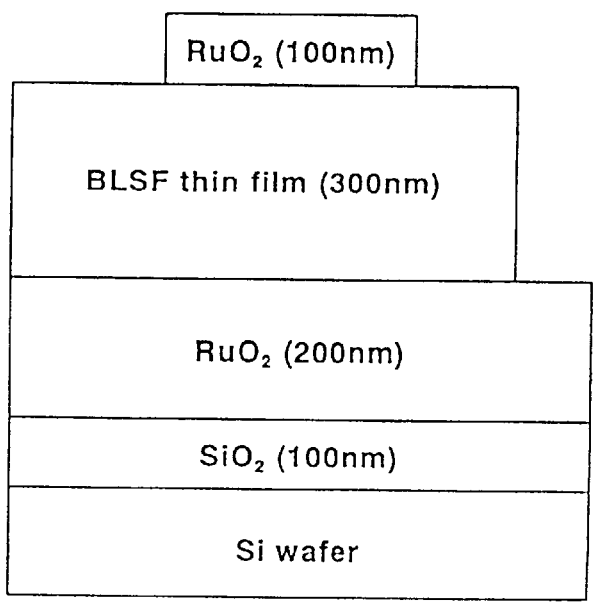
FIG. 6 shows schematically another structure of the ferroelectric capacitor used in Examples of the invention.
Figure 7:
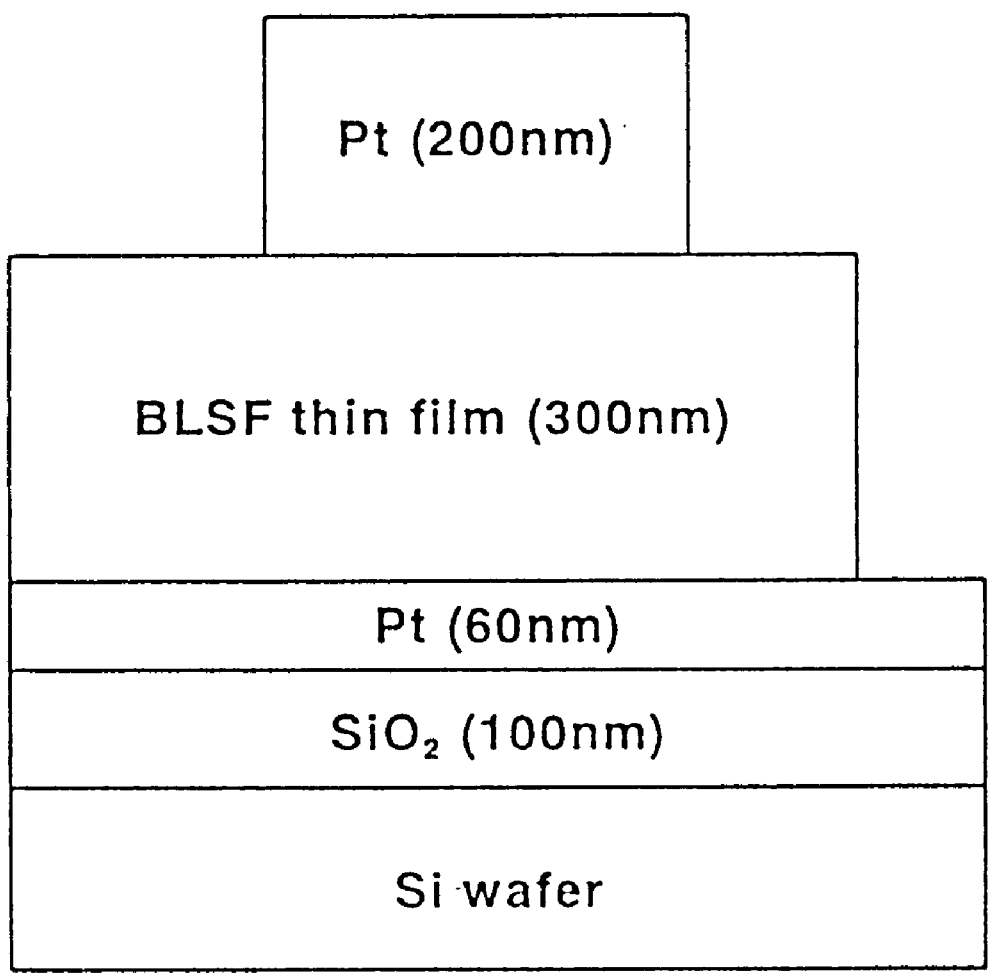
FIG. 7 shows schematically another structure of the ferroelectric capacitor used in Examples of the invention.

As shown in FIGS. 3 to 7, (1) a Pt upper electrode having a thickness of 200 nm (FIG. 7); (2) an Ir/$IrO_2$ upper electrode having a thickness of 100 nm/100 nm (FIG. 3); (3) an $IrO_2$ upper electrode having a thickness of 100 nm (FIG. 4); (4) an Ru/$RuO_2$ upper electrode having a thickness of 100 nm/100 nm (FIG. 5); and (5) an $RuO_2$ upper electrode having a thickness of 100 nm (FIG. 6), all having a diameter of 0.2 mm, were formed respectively on the above-mentioned ferroelectric thin films, and ferroelectric capacitors were formed therefrom without applying a secondary annealing.

As a result, the ferroelectric capacitors formed with the coating solutions 1 to 11 showed satisfactory hysteresis curves for any of the electrodes (1) to (5) under an applied voltage within a range of from 2 to 15 V. In the case of the comparative coating solutions 1 and 2, no hysteresis curve was observed when the electrodes (2) to (5) were used.

[Measurement of leakage current]

Figure 11:
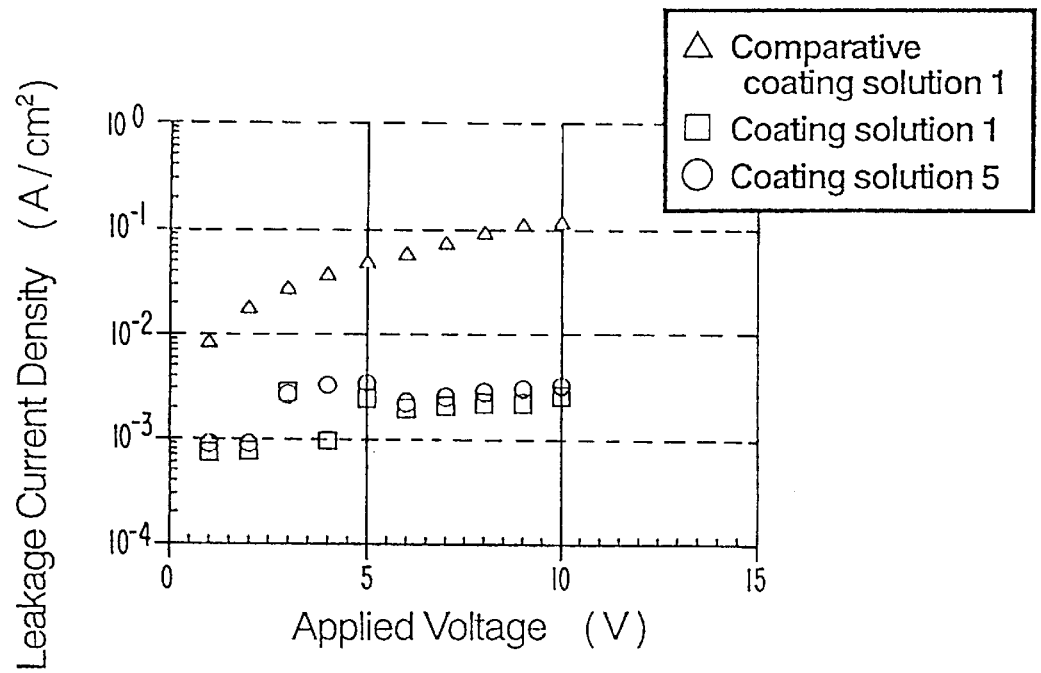
FIG. 11 is a graph illustrating the relationship between leakage current and applied voltage in a ferroelectric capacitor prepared by using the comparative coating solution 1, the coating solution 1, and the coating solution 5.

In the ferroelectric capacitor, a circuit was formed between the upper and the lower electrodes to investigate leakage current density ($A/cm^2$) at an applied voltage of 3 V: the mark ⊚ represents a value of density under $10^{-5.0}$; ○, from $10^{-2.0}$ to $10^{-5.0}$; and ×, $10^{-2.0}$ and over. The results are shown in Table 1.

metal (Sr, Bi and Ta) alkoxide solution (triangles in FIG. 11), use of a composite metal alkoxide solution permits reduction of leakage current to almost the same extent both in the case of a composite metal alkoxide solution of SrBi composite alkoxide and Ta alkoxide (circles in FIG. 11) and in the case of a composite metal alkoxide solution of SrBiTa composite alkoxide (squares in FIG. 11).

Figure 12:
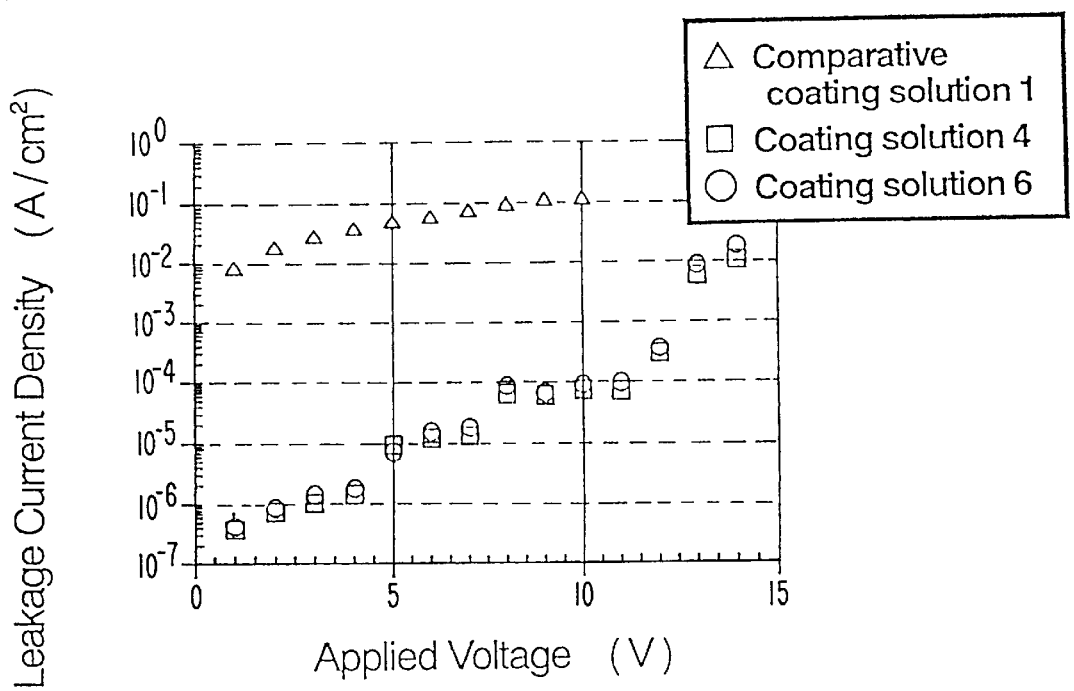
FIG. 12 is a graph illustrating the relationship between leakage current and applied voltage in a ferroelectric capacitor prepared by using the comparative coating solution 1, the coating solution 4, and the coating solution 6.

FIG. 12 illustrates the results of measurement of the relationship between leakage current and applied voltage on ferroelectric capacitors having the structure shown in FIG. 3 prepared by using the comparative coating solution 1, the coating solution 4 and the coating solution 6. As is clear from FIG. 12, as compared with the case using a mixed

TABLE 1

| | Ferroelectric thin film X-ray diffraction test | | | | | Ferroelectric capcaitor | | | | |
|---|---|---|---|---|---|---|---|---|---|---|
| | Lower | Lower | Lower | Lower | Lower | Leakage current test | | | | |
| Coating solution | electrode (1) | electrode (2) | electrode (3) | electrode (4) | electrode (5) | Electrode (1) | Electrode (2) | Electrode (3) | Electrode (4) | Electrode (5) |
| Coating solution 1 | ⊚ | ○ | ○ | ○ | ○ | ⊚ | ○ | ○ | ○ | ○ |
| Coating solution 2 | ⊚ | ⊚ | ○ | ⊚ | ○ | ⊚ | ○ | ○ | ○ | ○ |
| Coating solution 3 | ⊚ | ⊚ | ○ | ○ | ○ | ⊚ | ○ | ○ | ○ | ○ |
| Coating solution 4 | ⊚ | ⊚ | ⊚ | ⊚ | ⊚ | ⊚ | ⊚ | ⊚ | ⊚ | ⊚ |
| Coating solution 5 | ⊚ | ○ | ○ | ○ | ○ | ⊚ | ○ | ○ | ○ | ○ |
| Coating solution 6 | ⊚ | ⊚ | ⊚ | ⊚ | ⊚ | ⊚ | ⊚ | ⊚ | ⊚ | ⊚ |
| Coating solution 7 | ⊚ | ○ | ○ | ○ | ○ | ⊚ | ○ | ○ | ○ | ○ |
| Coating solution 8 | ⊚ | ⊚ | ⊚ | ⊚ | ⊚ | ⊚ | ⊚ | ⊚ | ⊚ | ⊚ |
| Coating solution 9 | ⊚ | ○ | ○ | ○ | ○ | ⊚ | ○ | ○ | ○ | ○ |
| Coating solution 10 | ⊚ | ⊚ | ⊚ | ⊚ | ⊚ | ⊚ | ⊚ | ⊚ | ⊚ | ⊚ |
| Coating solution 11 | ⊚ | ○ | ○ | ○ | ○ | ⊚ | ○ | ○ | ○ | ○ |
| Comparative coating solution 1 | ⊚ | x | x | x | x | ○ | x | x | x | x |
| Comparative coating solution 2 | x | x | x | x | x | x | x | x | x | x |

Some examples of graph illustrating the relationship between leakage current density and applied voltage are shown in FIGS. 10 to 14.

Figure 10:
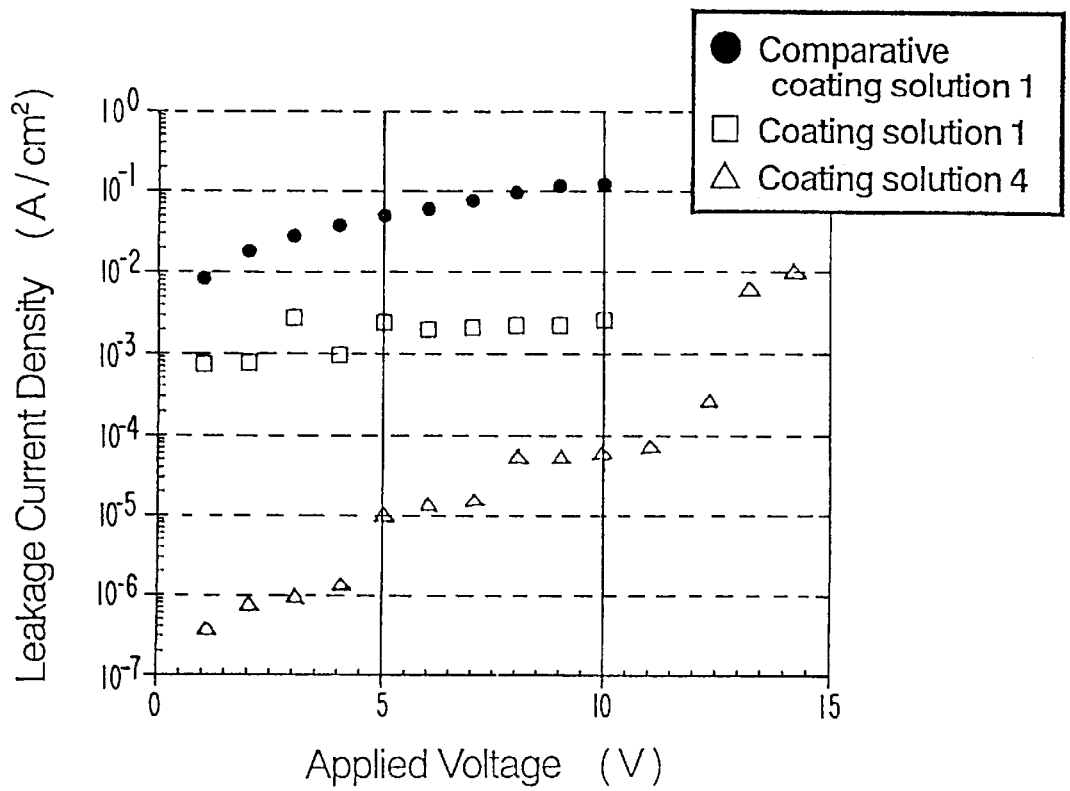
FIG. 10 is a graph illustrating the relationship between leakage current and applied voltage in a ferroelectric capacitor prepared by using the comparative coating solution 1, the coating solution 1, and the coating solution 4.

FIG. 10 illustrates the results of measurement of the relationship between leakage current and applied voltage on ferroelectric capacitors having a structure shown in FIG. 3 prepared by using the comparative coating solution 1, the coating solution 1 and the coating solution 4. As is clear from FIG. 10, as compared with the case using a mixed metal alkoxide solution (solid circles in FIG. 10), use of a composite metal alkoxide solution (squares in FIG. 10) permits reduction of leakage current, and further, hydrolysis (triangles in FIG. 10) enables to further reduce leakage current.

FIG. 11 illustrates the results of measurement of the relationship between leakage current and applied voltage on ferroelectric capacitors having a structure shown in FIG. 3 prepared by using the comparative coating solution 1, the coating solution 1 and the coating solution 5. As is clear from FIG. 11, as compared with the case using a mixed metal (Sr, Bi and Ta) alkoxide solution (triangles in FIG. 12), use of a hydrolyzed composite metal alkoxide solution brings about a remarkable effect of reducing leakage current both in the case of a composite metal alkoxide solution of SrBi composite alkoxide and Ta alkoxide (circles in FIG. 12) and in the case of a composite metal alkoxide solution of SrBiTa composite alkoxide (squares in FIG. 12).

Figure 13:
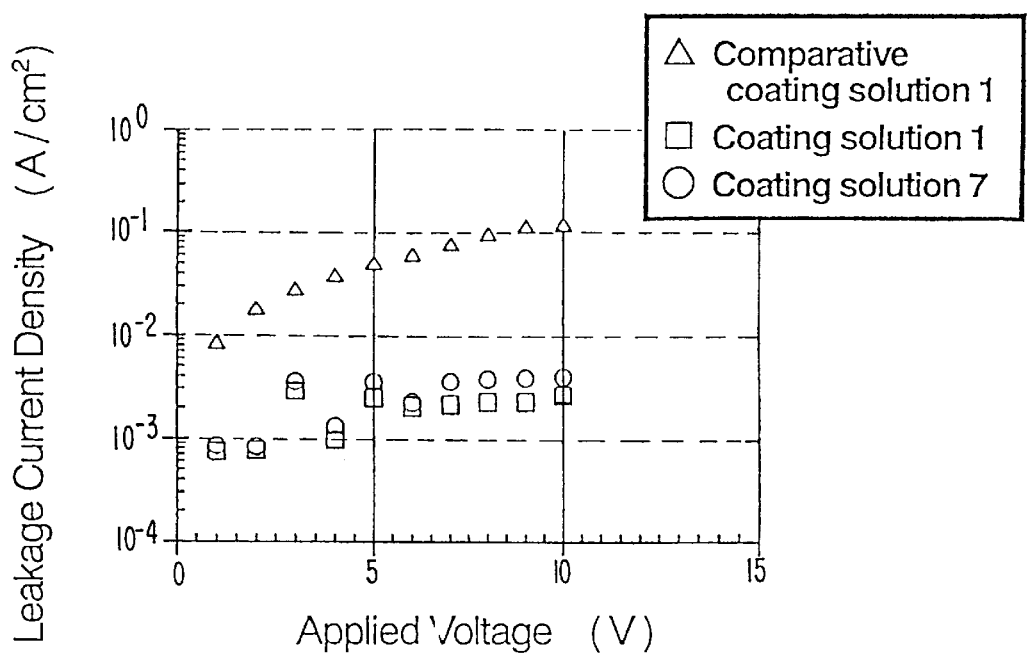
FIG. 13 is a graph illustrating the relationship between leakage current and applied voltage in a ferroelectric capacitor prepared by using the comparative coating solution 1, the coating solution 1, and the coating solution 7.

FIG. 13 illustrates the results of measurement of the relationship between leakage current and applied voltage on ferroelectric capacitors having the structure shown in FIG. 3 prepared by using the comparative coating solution 1, the coating solution 1 and the coating solution 7. As is clear from FIG. 13, as compared with the case using a mixed metal (Sr, Bi and Ta) alkoxide solution (triangles in FIG. 13), use of a composite metal alkoxide solution permits reduction of leakage current to almost the same extent both in the case of a composite metal alkoxide solution of BiTa composite alkoxide and Sr alkoxide (circles in FIG. 13), and in the case of a composite metal alkoxide solution of SrBiTa composite alkoxide (squares in FIG. 13).

Figure 14:
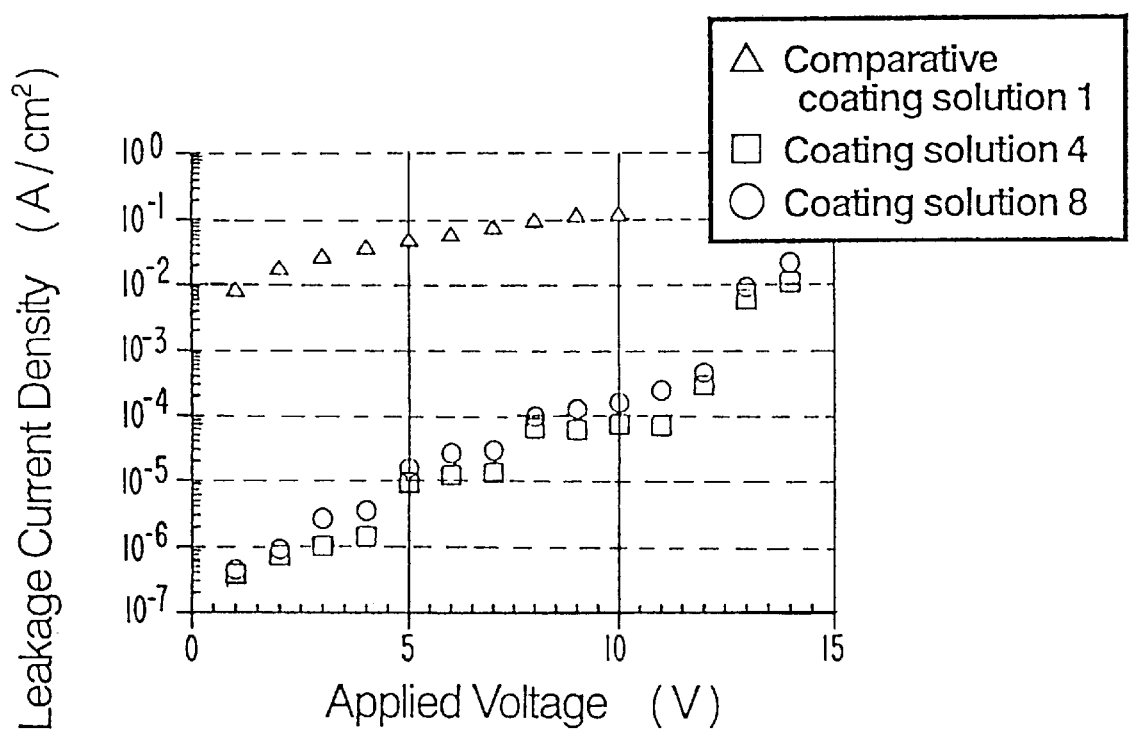
FIG. 14 is a graph illustrating the relationship between leakage current and applied voltage in a ferroelectric capacitor prepared by using the comparative coating solution 1, the coating solution 4, and the coating solution 8.

FIG. 14 illustrates the results of measurement of the relationship between leakage current and applied voltage on ferroelectric capacitors having the structure shown in FIG. 3 prepared by using the comparative coating solution 1, the coating solution 4 and the coating solution 8. As is clear from FIG. 14, as compared with the case using a mixed metal (Sr, Bi and Ta) alkoxide solution (triangles in FIG. 14), use of a hydrolyzed composite metal alkoxide solution brings about a remarkable effect of reducing leakage current both in the case of a composite metal alkoxide solution of BiTa composite alkoxide and Sr alkoxide (circles in FIG. 14) and in the case of a composite metal alkoxide solution of SrBiTa composite alkoxide (squares in FIG. 14).

According to the present invention, as described above in detail, there is provided a coating solution for forming a Bi-based ferroelectric thin film, which is capable of forming a dense film giving little leakage current, and excellent in keeping stability. By using this coating solution, it is possible to form a ferroelectric thin film, a ferroelectric capacitor and a ferroelectric memory applicable even on an electrode other than Pr one, at a low cost, with improved film density and surface morphology.

What is claimed is:

1. A ferroelectric thin film formed by preparing a coating solution containing metal alkoxides of Bi, metallic element A, wherein A is at least one metallic element selected from the group consisting of Bi, Pb, Ba, Sr, Ca, Na, K and rare earth elements, metallic element B, wherein B is at least one metallic element selected from the group consisting of Ti, Nb, Ta, W, Mo, Fe, Co and Cr, and an organometallic compound obtainable by hydrolyzing composite metal alkoxides formed by any two or more of said metal alkoxides by addition of water alone or in combination with a catalyst, followed by stirring at 20 to 50° C. for several hours to several days, then applying the coating solution onto an electrode on a substrate and then annealing the applied coating.

2. A ferroelectric thin film according to claim 1, wherein the said electrode is made of at least one metal or metal oxide selected from the group consisting of Ir, Ru, Rh, Re, Os and metal oxides thereof.

3. A ferroelectric thin film according to claim 1, formed by applying the coating solution of claim 1, onto an electrode on a substrate, exposing the applied coating to a humidified atmosphere, and then annealing the coating.

4. A ferroelectric thin film according to claim 3, wherein the said electrode is made of at least one metal or metal oxide selected from the group consisting of Ir, Ru, Rh, Re, Os and metal oxides thereof.

* * * * *